United States Patent
Lin et al.

(10) Patent No.: US 11,728,376 B2
(45) Date of Patent: Aug. 15, 2023

(54) STRUCTURE AND FORMATION METHOD OF SEMICONDUCTOR DEVICE STRUCTURE WITH GATE STACK

(71) Applicant: Taiwan Semiconductor Manufacturing Co., Ltd., Hsinchu (TW)

(72) Inventors: Chih-Wei Lin, Hsinchu (TW); Chih-Lin Wang, Hsinchu County (TW); Kang-Min Kuo, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/445,692

(22) Filed: Aug. 23, 2021

(65) Prior Publication Data

US 2021/0384294 A1 Dec. 9, 2021

Related U.S. Application Data

(60) Continuation of application No. 16/595,100, filed on Oct. 7, 2019, now Pat. No. 11,101,344, which is a
(Continued)

(51) Int. Cl.
*H01L 29/06* (2006.01)
*H01L 21/28* (2006.01)
*H01L 29/66* (2006.01)
*H01L 29/78* (2006.01)

(52) U.S. Cl.
CPC .... *H01L 29/0607* (2013.01); *H01L 21/28264* (2013.01); *H01L 29/66545* (2013.01);
(Continued)

(58) Field of Classification Search
CPC ........ H01L 29/66545; H01L 29/66606; H01L 29/66871; H01L 29/4925–4941; H01L 29/4958; H01L 29/517; H01L 29/518; H01L 21/02142–02161; H01L 21/0214; H01L 21/0217; H01L 21/02321–02332; H01L 21/02197; H01L 21/02175–02194;
(Continued)

(56) References Cited

U.S. PATENT DOCUMENTS 5,268,208 A   12/1993  Krisko et al.
7,919,820 B2  4/2011   Chung et al.
(Continued)

FOREIGN PATENT DOCUMENTS

CN  102903741 A   1/2013
KR  100868768 B1  11/2008
KR  100899565 B1  8/2009

*Primary Examiner* — Sonya McCall-Shepard
*(74) Attorney, Agent, or Firm* — Haynes and Boone, LLP (57) ABSTRACT

Structures and formation methods of a semiconductor device structure are provided. The semiconductor device structure includes a semiconductor substrate and a gate stack over the semiconductor substrate. The gate stack includes a gate dielectric layer and a work function layer. The gate dielectric layer is between the semiconductor substrate and the work function layer. The semiconductor device structure also includes a halogen source layer. The gate dielectric layer is between the semiconductor substrate and the halogen source layer.

20 Claims, 9 Drawing Sheets

Related U.S. Application Data division of application No. 15/830,979, filed on Dec. 4, 2017, now Pat. No. 10,439,022, which is a continuation of application No. 14/954,524, filed on Nov. 30, 2015, now Pat. No. 9,837,487.

(52) U.S. Cl.
CPC ...... *H01L 29/66795* (2013.01); *H01L 29/785* (2013.01); *H01L 29/7848* (2013.01)

(58) Field of Classification Search
CPC ......... H01L 21/28088; H01L 21/28568; H01L 29/4966; H01L 21/823821; H01L 21/823828; H01L 27/0924; H01L 29/785; H01L 21/823842

See application file for complete search history.

(56) References Cited

U.S. PATENT DOCUMENTS

| | | |
|---|---|---|
| 7,943,457 B2 | 5/2011 | Chudzik et al. |
| 8,105,931 B2 | 1/2012 | Hsu et al. |
| 8,188,547 B2 | 5/2012 | Manabe et al. |
| 8,349,680 B2 | 1/2013 | Thei et al. |
| 8,383,502 B2 | 2/2013 | Chen et al. |
| 8,536,038 B2 | 9/2013 | Wang et al. |
| 8,679,962 B2 | 3/2014 | Hou et al. |
| 8,921,181 B2 | 12/2014 | Pramanik |
| 9,324,716 B2 | 4/2016 | Kim et al. |
| 9,583,486 B1 | 2/2017 | Ando et al. |
| 9,595,443 B2 | 3/2017 | Zhu et al. |
| 9,755,039 B2 | 9/2017 | Tsau |
| 2007/0272975 A1 | 11/2007 | Schaeffer et al. |
| 2008/0251819 A1 | 10/2008 | Taketani |
| 2012/0070948 A1 | 3/2012 | Cheng et al. |
| 2014/0077313 A1 | 3/2014 | Li et al. |
| 2014/0183666 A1 | 7/2014 | Pramanik |
| 2016/0225871 A1 | 8/2016 | Cheng et al. |
| 2016/0315088 A1 | 10/2016 | Kang et al. |
| 2016/0315191 A1 | 10/2016 | Tsai et al. |
| 2017/0032972 A1* | 2/2017 | Tsai .................... H01L 29/785 |
| 2017/0062561 A1 | 3/2017 | Peng et al. |

* cited by examiner

STRUCTURE AND FORMATION METHOD OF SEMICONDUCTOR DEVICE STRUCTURE WITH GATE STACK

PRIORITY DATA

The present application is a continuation application of U.S. patent application Ser. No. 16/595,100, filed Oct. 7, 2019, issuing as U.S. Pat. No. 11,101,344, which is a divisional application of U.S. patent application Ser. No. 15/830,979, filed Dec. 4, 2017, issuing as U.S. Pat. No. 10,439,022, which is a continuation application of U.S. patent application Ser. No. 14/954,524, filed Nov. 30, 2015, now U.S. Pat. No. 9,837,487, entitled "STRUCTURE AND FORMATION METHOD OF SEMICONDUCTOR DEVICE STRUCTURE WITH GATE STACK", hereby incorporated by reference in their entireties.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1D are perspective views of various stages of a process for forming a semiconductor device structure, in accordance with some embodiments. FIGS. 2A-2D are cross-sectional views of various stages of a process for forming a semiconductor device structure, in accordance with some embodiments. In some embodiments, some of the cross-sectional views in FIGS. 2A-2D correspond to the cross-sectional views taken along the line I-I in FIGS. 1B-1D. Additional operations can be provided before, during, and/or after the stages described in FIGS. 1A-1D or FIGS. 2A-2D. Some of the stages that are described can be replaced or eliminated for different embodiments. Additional features can be added to the semiconductor device structure. Some of the features described below can be replaced or eliminated for different embodiments.

Figure 1A:
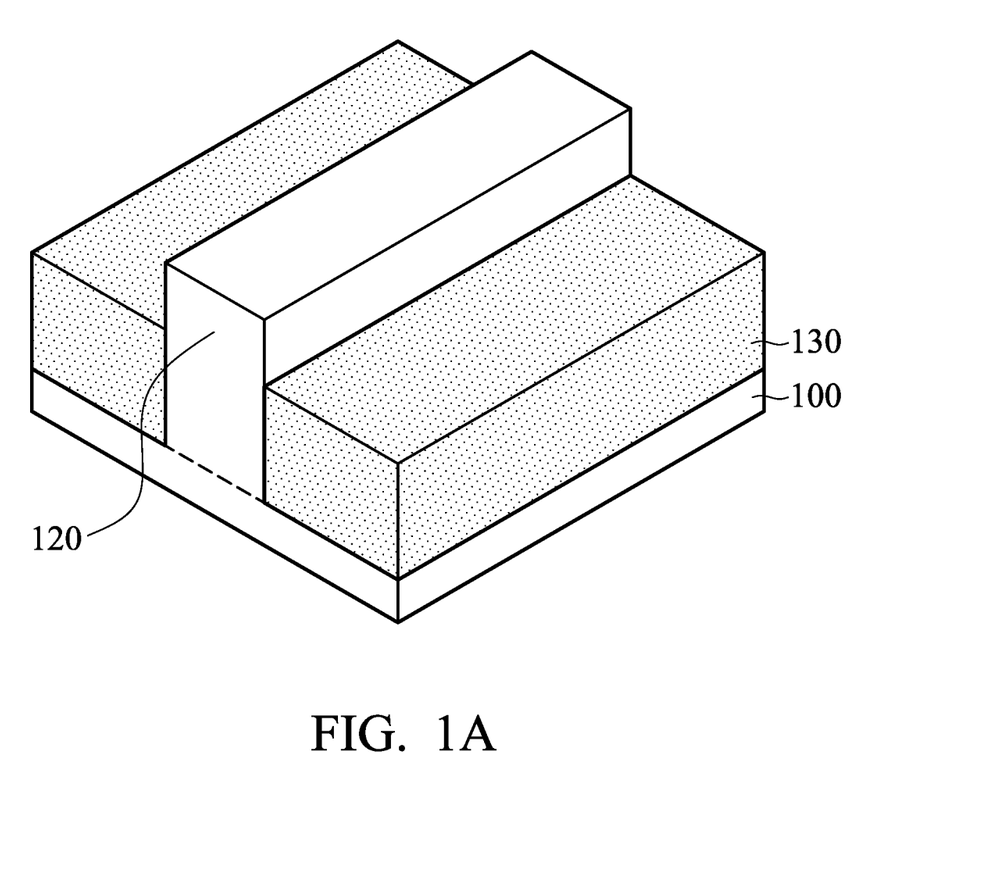
FIGS. 1A-1D are perspective views of various stages of a process for forming a semiconductor device structure, in accordance with some embodiments.
Figure 2A:
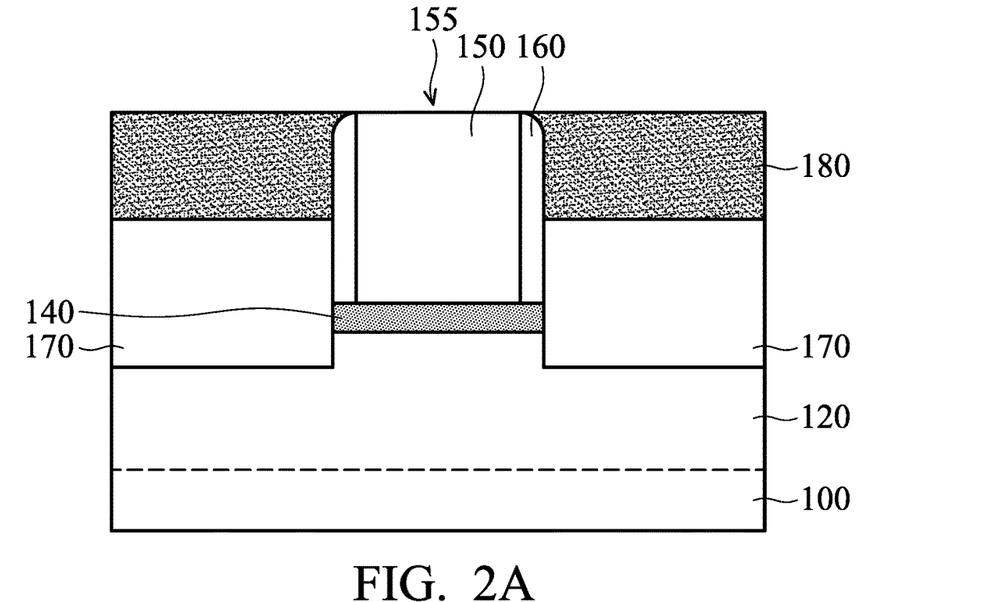
FIGS. 2A-2D are cross-sectional views of various stages of a process for forming a semiconductor device structure, in accordance with some embodiments.

As shown in FIGS. 1A and 2A, one or more fin structures including a fin structure 120 are formed over a semiconductor substrate 100, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, multiple recesses (or trenches) are formed in the semiconductor substrate 100. As a result, multiple fin structures including the fin structure 120 are formed between the recesses. For simplicity, only one of the fin structures (the fin structure 120) is shown in FIGS. 1A and 2A. In some embodiments, one or more photolithography and etching processes are used to form the recesses.

As shown in FIGS. 1A and 2A, isolation features 130 are formed in the recesses to surround a lower portion of the fin structure 120, in accordance with some embodiments. In some embodiments, the isolation features 130 continuously surround the lower portion of the fin structures 102. In some embodiments, the isolation features 130 surround lower portions of other fin structures formed on the semiconductor substrate 100. The isolation features 130 are used to define and electrically isolate various device elements formed in and/or over the semiconductor substrate 100. In some embodiments, the isolation features 130 include shallow trench isolation (STI) features, local oxidation of silicon (LOCOS) features, other suitable isolation features, or a combination thereof.

In some embodiments, each of the isolation features 130 has a multi-layer structure. In some embodiments, the isolation features 130 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 130. The STI liner may also be used to reduce crystalline defects at the interface between the fin structures and the isolation features 130.

In some embodiments, a dielectric material layer is deposited over the semiconductor substrate 100. The dielectric material layer covers the fin structures including the fin structure 120 and fills the recesses between the fin structures. In some embodiments, a planarization process is performed to thin down the dielectric material layer. For example, the dielectric material layer is thinned until the fin structure 120 is exposed. The planarization process may include a chemical mechanical polishing (CMP) process, a grinding process, a dry polishing process, an etching process, another applicable process, or a combination thereof. Afterwards, the dielectric material layer is etched back to be below the top of the fin structure 120. As a result, the isolation features 130 are formed. The fin structures including the fin structure 120 protrude from top surfaces of the isolation features 130, as shown in FIGS. 1A and 2A in accordance with some embodiments.

Figure 1B:
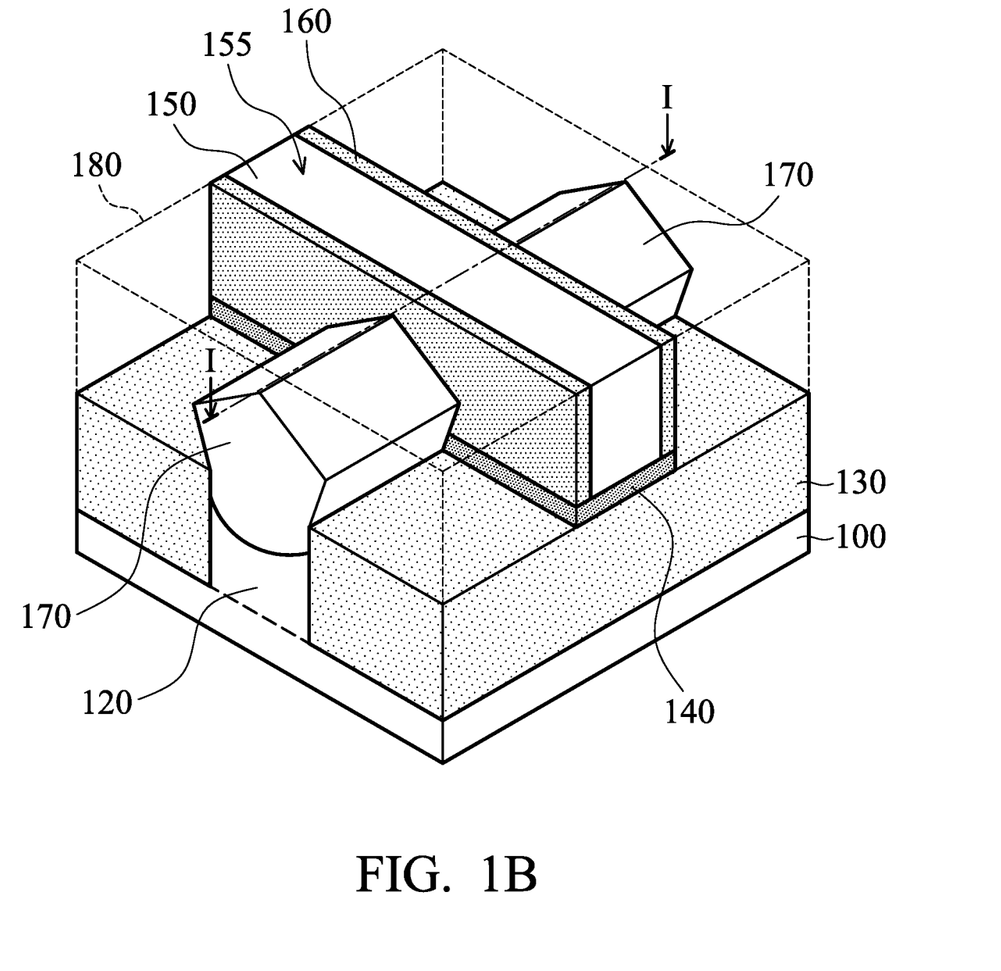

As shown in FIGS. 1B and 2A, a dummy gate stack 155 including a gate dielectric layer 140 and a gate electrode 150 are formed over the fin structure 120 and the semiconductor substrate 100, in accordance with some embodiments. The dummy gate stack 155 covers a portion of the fin structure 120. In some embodiments, the dummy gate stack 155 covers portions of multiple fin structures including the fin structure 120.

In some embodiments, the gate dielectric layer 140 is made of silicon oxide, silicon nitride, silicon oxynitride, dielectric material with a high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 140 is a dummy gate dielectric layer which will subsequently be removed. In some other embodiments, the gate dielectric layer 140 is not formed.

In some embodiments, the gate dielectric layer 140 is deposited over the isolation features 103 and the fin structure 120 using a chemical vapor deposition (CVD) process, an atomic layer deposition (ALD) process, a thermal oxidation process, a physical vapor deposition (PVD) process, another applicable process, or a combination thereof.

Afterwards, the gate electrode 150 is formed over the gate dielectric layer 140 to cover a portion of the fin structure 120, as shown in FIGS. 1B and 2A in accordance with some embodiments. In some embodiments, the gate electrode 150 is a dummy gate electrode which will be replaced with a metal gate electrode. In some embodiments, the gate electrode 150 is made of polysilicon.

In some embodiments, a gate electrode layer is deposited over the gate dielectric layer 140. The gate electrode layer may be deposited using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer is used to pattern the gate electrode layer into one or more gate electrodes including the gate electrode 150. One or more etching processes may be used to etch the gate electrode layer through openings of the patterned hard mask layer so as to form the dummy gate stack 155.

Afterwards, spacer elements 160 are formed over sidewalls of the gate electrode 150, as shown in FIGS. 1B and 2A in accordance with some embodiments. The spacer elements 160 may be used to assist in a subsequent formation of source/drain features. In some embodiments, the spacer elements 160 include one or more layers. In some embodiments, the spacer elements 160 are made of a dielectric material. The dielectric material may include silicon nitride, silicon oxide, silicon oxynitride, silicon carbide, another suitable material, or a combination thereof.

In some embodiments, a spacer material layer is deposited over the dummy gate stack 155 using a CVD process, a PVD process, a spin-on process, another applicable process, or a combination thereof. Afterwards, the spacer material layer is partially removed using an etching process, such as an anisotropic etching process. As a result, remaining portions of the spacer material layer on the sidewalls of the dummy gate stack 155 form the spacer elements 160, as shown in FIGS. 1B and 2A. In some embodiments, the spacer elements 160 are formed after the portion of the gate dielectric layer 140 not covered by the gate electrode 150 is removed. In some embodiments, the gate dielectric layer 140 not covered by the gate electrode 150 is removed together with the spacer material layer during the etching process for forming the spacer elements 160.

Afterwards, source/drain features 170 are formed on the fin structure 120, as shown in FIGS. 1B and 2A in accordance with some embodiments. In some embodiments, the fin structure 120 not covered by the gate electrode 150 and the spacer elements 160 is partially removed to form recesses using, for example, an etching process. The bottoms of the recesses may be below the top surfaces of the isolation features 130. Afterwards, source/drain features 170 are formed in the recesses. In some embodiments, the source/drain features 170 are epitaxially grown features formed using an epitaxial growth process. In some embodiments, the source/drain features 170 protrude from the recesses. In some embodiments, the source/drain features 170 are also used as stressors that can apply strain or stress on the channel region between the source/drain features 170. The carrier mobility may be improved accordingly.

As shown in FIGS. 1B and 2A, a dielectric layer 180 is then formed to surround the dummy gate stack 155 and the source/drain features 170, in accordance with some embodiments. For a better understanding of the disclosure, the dielectric layer 180 in FIG. 1B is illustrated in dashed lines such that the elements covered by the dielectric layer 180 is visible. In some embodiments, a dielectric material layer is deposited to cover the source/drain features 170, the spacer elements 160, and the gate electrode 150.

In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, a planarization process may be used to partially remove the dielectric material layer. The dielectric material layer may be partially removed until the gate electrode 150 is exposed. As a result, the dielectric layer 180 is formed. In some embodiments, the planarization process includes a CMP process, a grinding process, a dry polishing process, an etching process, another applicable process, or a combination thereof.

Figure 1C:
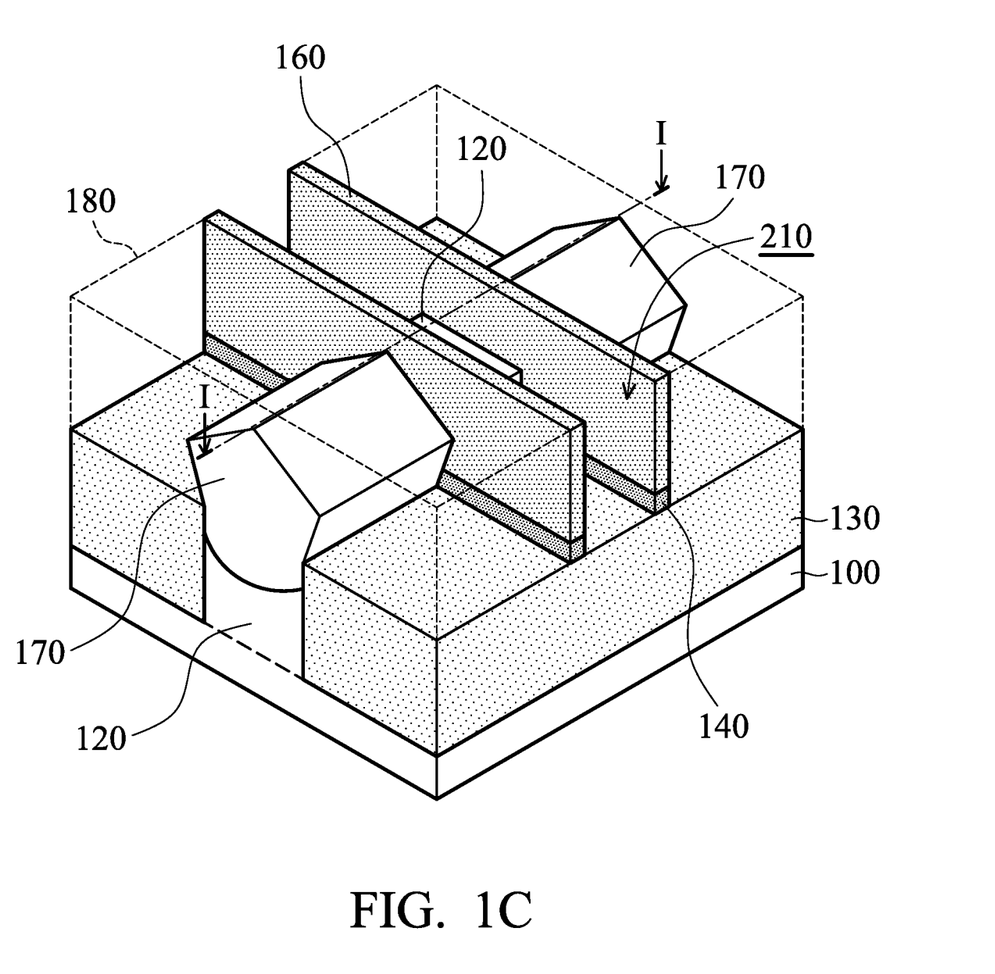
Figure 2B:
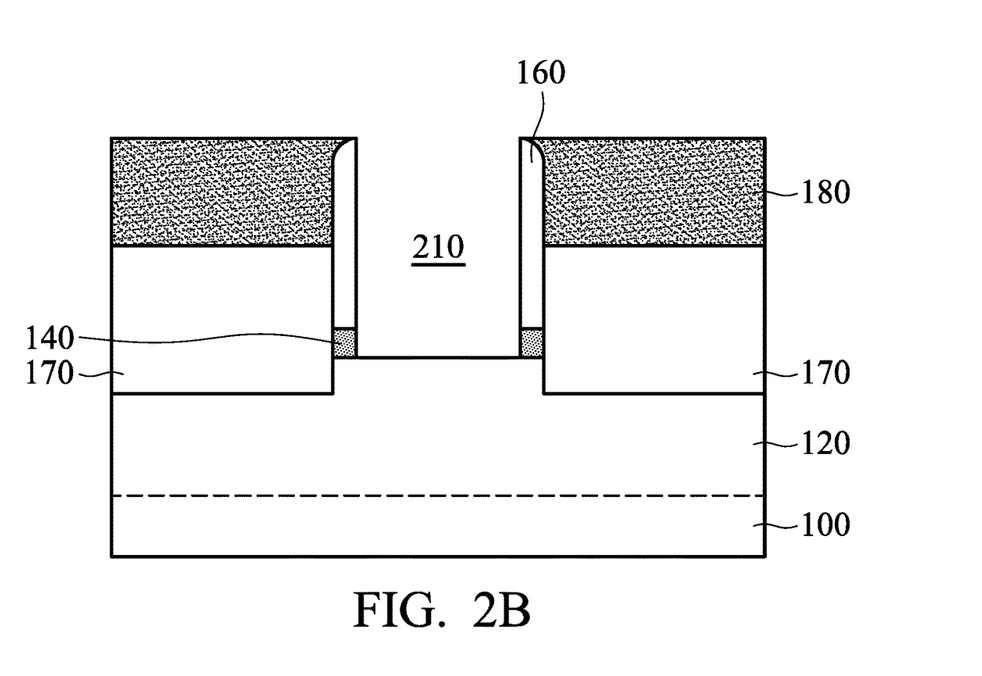

As shown in FIGS. 1C and 2B, the gate electrode 150 and a portion of the gate dielectric layer 140 are removed to form a recess 210, in accordance with some embodiments. The recess 210 is surrounded by the dielectric layer 180 and positioned between the spacer elements 160. The recess 210 exposes the fin structure 120. One or more etching processes may be used to form the recess 210. In some embodiments, a portion of the gate dielectric layer 140 directly under the spacer elements 160 remains without being removed.

Figure 2C:
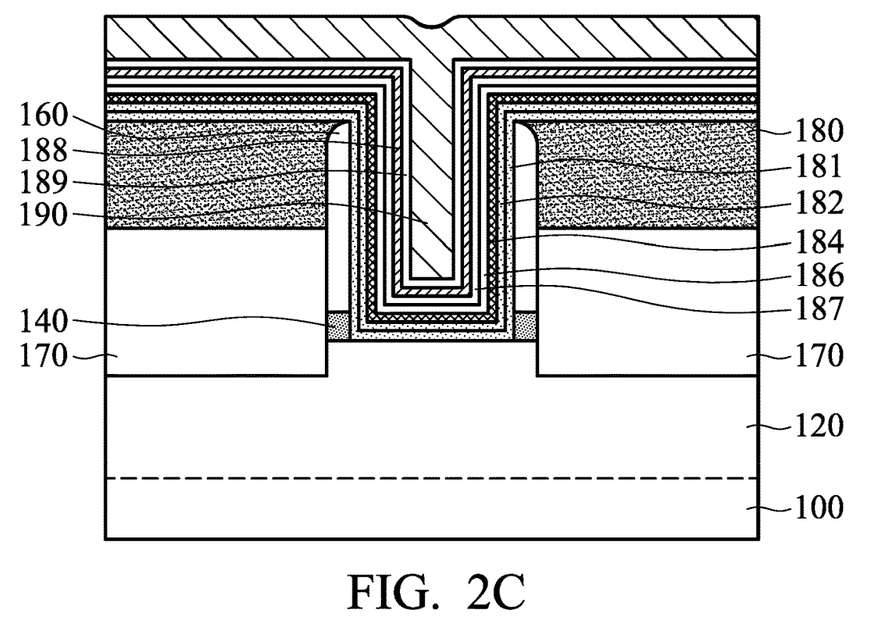

As shown in FIG. 2C, an interfacial layer 181 is deposited over the dielectric layer 180 and sidewalls and a bottom of the recess 210, in accordance with some embodiments. In some embodiments, the interfacial layer 181 conformally covers the fin structure 120 exposed by the recess 210 and the sidewalls and bottom of the recess 210. The interface layer 181 may be used to improve adhesion between the fin structure 120 and a subsequently formed gate dielectric layer. In some embodiments, the interfacial layer is made of a semiconductor oxide material, such as silicon oxide, germanium oxide, or silicon germanium oxide. In some embodiments, the interfacial layer 181 is deposited using an ALD process, a CVD process, a thermal oxidation process, another applicable process, or a combination thereof.

As shown in FIG. 2C, a gate dielectric layer 182 is deposited over the interfacial layer 181, in accordance with some embodiments. In some embodiments, the gate dielectric layer 182 conformally covers the fin structure 120 and the sidewalls and bottom of the recess 210. In some embodiments, the gate dielectric layer 182 and the gate dielectric layer 140 under the spacer elements 180 are made of different materials. In some embodiments, the gate dielectric layer 182 is made of a high-K dielectric material. The high-K dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 182 is deposited using an ALD process, a CVD process, another applicable process, or a combination thereof.

Afterwards, a halogen source layer 184 is formed over the gate dielectric layer 182, as shown in FIG. 2C in accordance with some embodiments. In some embodiments, the halogen source layer 184 is in direct contact with the gate dielectric layer 182. In some other embodiments, a material layer (not shown) is formed between the halogen source layer 184 and the gate dielectric layer 182. In some cases, the halogen source layer 184 is not in direct contact with the gate dielectric layer 182. In some embodiments, the halogen source layer 184 has a thickness in a range from about 1 Å to about 10 Å. In some other embodiments, the halogen source layer 184 has a thickness in a range from about 2 Å to about 15 Å. In some cases, the halogen source layer 184 should not be too thick to ensure that a distance between the gate dielectric layer 182 and a subsequently formed work function layer is maintained in an acceptable range. In some embodiments, the thickness of the halogen source layer 184 is controlled to be smaller than about 15 Å. In some other embodiments, the thickness of the halogen source layer 184 is controlled to be smaller than about 10 Å.

The halogen source layer 184 may be used to prove halogen elements (or ions) to an interface between the fin structure 120 and the interfacial layer 181. The halogen elements (or ions) may be able to repair defects (such as dangling bonds) at the interface between the fin structure 120 and the interfacial layer 181. For example, the halogen elements or ions from the halogen source layer 184 may diffuse through the gate dielectric layer 182 and the interfacial layer 181 to reach the interface and repair the defects. As a result, the performance and reliability of the semiconductor device structure are improved. For example, the carrier mobility of the fin structure 120 is improved and becomes more stable.

In some embodiments, the halogen source layer 184 includes one or more kinds of halogen elements (or ions). In some embodiments, the halogen source layer 184 includes fluorine (F), chlorine (Cl), bromine (Br), another suitable element (or ion), or a combination thereof. In some embodiments, the halogen source layer 184 includes oxygen (O). In these cases, the halogen source layer 184 may also serve as an oxygen source layer. The oxygen elements (or ions) from the halogen source layer 184 may enter the gate dielectric layer 182 to repair defects (such as oxygen vacancies) in the gate dielectric layer 182. The quality of the gate dielectric layer 182 is therefore improved.

In some embodiments, the halogen source layer 184 includes a metal element. In some embodiments, the halogen source layer 184 includes titanium (Ti), tantalum (Ta), another suitable element, or a combination thereof. In some embodiments, the halogen layer 184 is electrically conductive. In some embodiments, the conductivity of the halogen layer 184 is greater than that of the gate dielectric layer 182 or the interfacial layer 18L In some embodiments, the halogen source layer 184 is a Ti—N—O-and-F-containing layer, a Ta—N—O-and-F-containing layer, a Ti—N-and-F-containing layer, a Ta—N-and-F-containing layer, another suitable layer, or a combination thereof.

In some embodiments, the halogen source layer 184 is formed over the gate dielectric layer 182 using an ALD process, a CVD process, another applicable process, or a combination thereof. In some embodiments, the formation of the halogen source layer 184 involves a thermal process, an in-situ ash process, an ex-situ ash process, a plasma process, another applicable process, or a combination thereof. In some embodiments, the halogen source layer 184 is a metal-containing layer doped with a halogen element. In some embodiments, the halogen source layer 184 is a metal nitride layer doped with a halogen element. In some embodiments, the halogen source layer 184 is a halogen-doped region within a material layer. For example, the halogen source layer 184 is a halogen-doped region within a material nitride layer. In these cases, the formation of the halogen source layer 184 involves an ALD process, a CVD process, an implantation process, a diffusion process, another applicable process, or a combination thereof.

In some embodiments, the halogen source layer 184 has an atomic concentration of a halogen element, such as fluorine. In some embodiments, the atomic concentration of the halogen element in the halogen source layer 184 is substantially uniform. In some other embodiments, the atomic concentration of the halogen element in the halogen source layer 184 is not uniform. In some embodiments, the atomic concentration of the halogen element in the halogen source layer 184 gradually becomes smaller along a direction from a top of the halogen source layer 184 towards the gate dielectric layer 182.

As shown in FIG. 2C, a capping layer 186 is deposited over the halogen source layer 184, in accordance with some embodiments. The capping layer 186 may be used to protect the structures below the capping layer 186. The capping layer 186 may prevent oxygen above the capping layer 186 from entering the gate dielectric layer 182 and the interfacial layer 181 during subsequent processes that may involve a thermal operation. Therefore, the thickness of the gate dielectric layer 182 or the interfacial layer 181 may remain substantially the same.

In some embodiments, the capping layer 186 includes a metal element and an oxygen element. In some embodiments, the capping layer 186 is made of titanium nitride, tantalum nitride, another suitable material, or a combination thereof. In some embodiments, the capping layer 186 is thicker than the halogen source layer 184. In some embodiments, the capping layer 186 has a thickness in a range from about 10 Å to about 30 Å. In some embodiments, the capping layer 186 is deposited using a CVD process, an ALD process, a PVD process, an electroplating process, an electroless plating process, another applicable process, or a combination thereof. In some other embodiments, the capping layer 186 is not formed.

In some embodiments, the capping layer 186 is formed after the formation of the halogen source layer 182. However, embodiments of the disclosure are not limited thereto. Many variations and/or modifications can be made to embodiments of the disclosure. In some other embodiments, the capping layer 186 is formed before the formation of the halogen source layer 182.

Figure 5A:
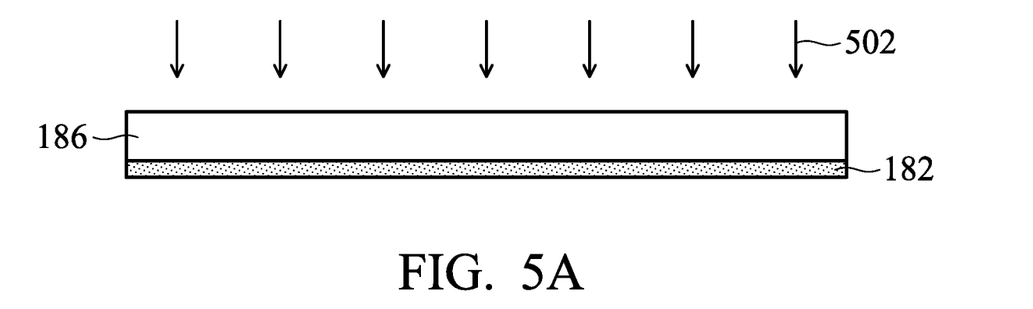
FIGS. 5A-5B are cross-sectional views of various stages of a process for forming a semiconductor device structure, in accordance with some embodiments.
Figure 5B:
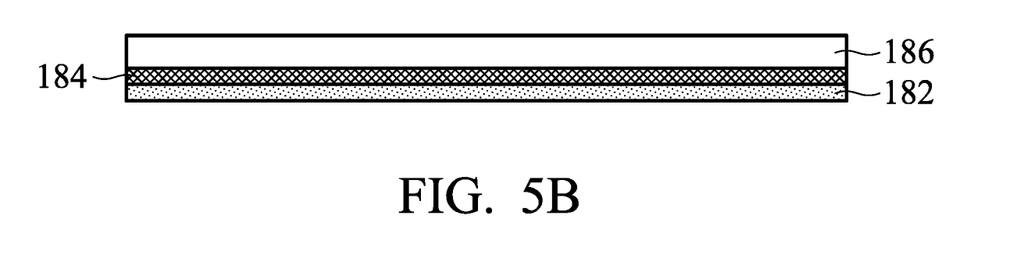

FIGS. 5A-5B are cross-sectional views of various stages of a process for forming a semiconductor device structure, in accordance with some embodiments. As shown in FIG. 5A, the capping layer 186 is deposited over the gate dielectric layer 182 before the formation of the halogen source layer 184, in accordance with some embodiments. Afterwards, a doping process 502 is performed on the capping layer 186, as shown in FIG. 5A in accordance with some embodiments. In some embodiments, the doping process 502 is an implantation process.

As shown in FIG. 5B, the doping process 502 dope a portion of the capping layer to forms the halogen source layer 184 within the capping layer 186, in accordance with some embodiments. In these cases, the halogen source layer 184 is also a halogen-doped region within the capping layer 186. The position (or depth) of the halogen source layer 184 within the capping layer 186 may be controlled through tuning the process parameter of the doping process 502. For example, the implantation energy and/or dosage may be varied to control the position of the halogen source layer 184. In some embodiments, the doping process 502 is fine-tuned such that the halogen source layer 184 (the halogen-doped region) is in direct contact with the gate dielectric layer 182. In some embodiments, the atomic concentration of the halogen element in the halogen source layer 184 (the halogen-doped region) gradually becomes smaller along a direction from a top of the halogen source layer 184 towards the gate dielectric layer 182. In some embodiments, since the halogen source layer 184 is a doped region within the capping layer 186, the distance between the fin structure 120 and a subsequently formed work function layer does not increase after the formation of the halogen source layer 184. The performance of the semiconductor device structure is therefore ensured.

Figure 6:
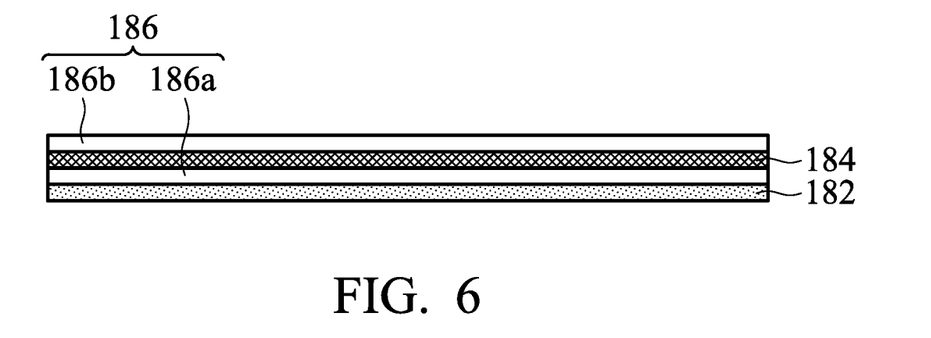
FIG. 6 is a cross-sectional view of a semiconductor device structure, in accordance with some embodiments.

Many variations and/or modifications can be made to embodiments of the disclosure. FIG. 6 is a cross-sectional view of a semiconductor device structure, in accordance with some embodiments. In some embodiments, the halogen source layer 184 is not in direct contact with the gate dielectric layer 182, as shown in FIG. 6. In some embodiments, the halogen source layer 184 is a halogen-doped region that is formed within the capping layer 186. As shown in FIG. 6, the halogen source layer 184 (the halogen-doped region) is between an upper portion 186b and a lower portion 186a of the capping layer 186, in accordance with some embodiments.

As shown in FIG. 2C, a barrier layer 187 is deposited over the capping layer 186, in accordance with some embodiments. The barrier layer 187 may be made of tantalum nitride, titanium nitride, another suitable material, or a combination thereof. In some embodiments, the barrier layer 187 has a thickness in a range from about 8 Å to about 12 Å. In some embodiments, the barrier layer 187 is deposited using a CVD process, an ALD process, a PVD process, an electroplating process, an electroless plating process, another applicable process, or a combination thereof. In some other embodiments, the barrier layer 187 is not formed.

Afterwards, a work function layer 188 is deposited over the barrier layer 187, as shown in FIG. 2C in accordance with some embodiments. In some embodiments, the work function layer 188 conformally covers the fin structure 120. The work function layer 188 is used to provide the desired work function for transistors to enhance device performance, such as improved threshold voltage. In some embodiments, the work function layer 188 is an n-type metal layer capable of providing a work function value suitable for the device, such as equal to or less than about 4.5 eV. In some embodiments, the work function layer 188 is a p-type metal layer capable of providing a work function value suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 188 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 188 may be fine-tuned to adjust the work function level. For example, a titanium nitride layer may be used as a p-type metal layer or an n-type metal layer, depending on the thickness and/or the compositions of the titanium nitride layer. In some embodiments, the work function layer 188 is a stack of multiple sub-layers. In some embodiments, the work function layer 188 is deposited using a CVD process, an ALD process, a PVD process, an electroplating process, an electroless plating process, another applicable process, or a combination thereof.

Afterwards, a glue layer (or a wetting layer) 189 is deposited over the work function layer 188, as shown in FIG. 2C in accordance with some embodiments. The glue layer (or a wetting layer) 189 may be used to facilitate a subsequent formation of a conductive filling layer. The glue layer (or the wetting layer) 189 may be made of cobalt, titanium nitride, tantalum nitride, another suitable material, or a combination thereof. In some embodiments, the glue layer (or the wetting layer) 189 is deposited using a CVD process, an electroplating process, a PVD process, an electroless plating process, another applicable process, or a combination thereof. In some other embodiments, the glue layer (or the wetting layer) 189 is not formed.

Afterwards, a conductive filling layer 190 is deposited over the glue layer (or the wetting layer) 189 to fill the recess 210, as shown in FIG. 2C in accordance with some embodiments. In some embodiments, the conductive filling layer 190 is made of tungsten, aluminum, copper, gold, platinum, another suitable material, or a combination thereof. In some embodiments, the conductive filling layer 190 is deposited using a CVD process, an electroplating process, a PVD process, an electroless plating process, another applicable process, or a combination thereof.

Figure 1D:
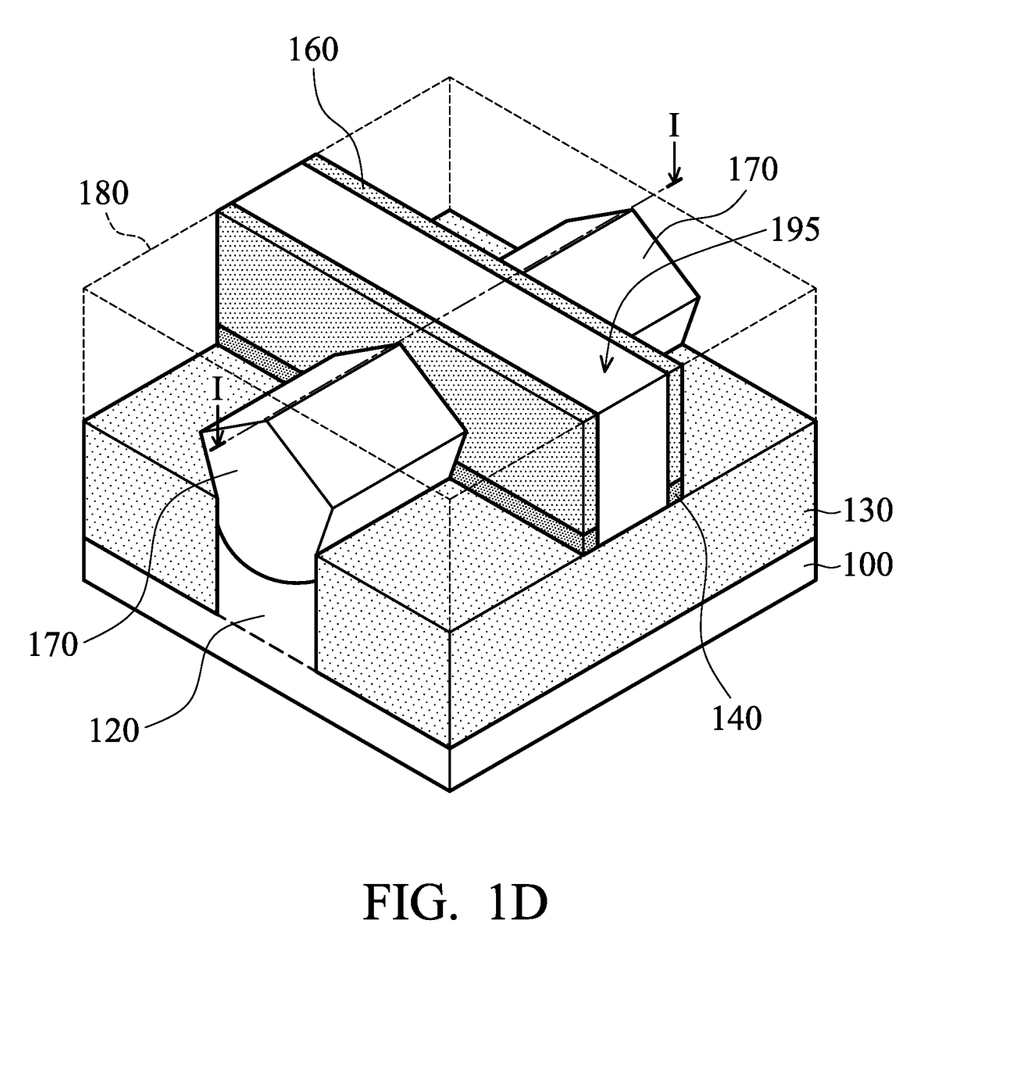
Figure 2D:
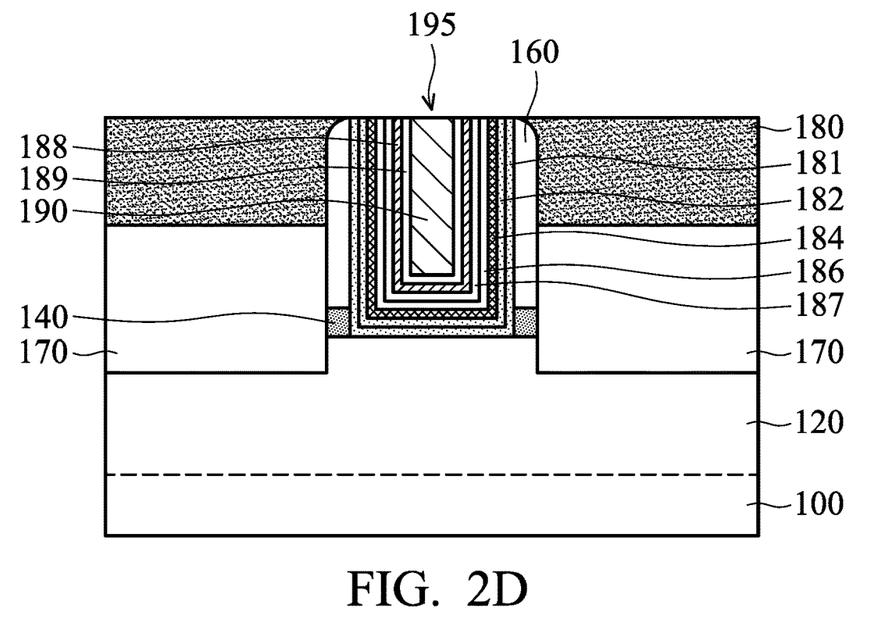

As shown in FIG. 2D, a planarization process is performed to remove the portions of the metal gate stack layers outside of the recess 210, in accordance with some embodiments. As a result, the remaining portions of the metal gate stack layers together form a gate stack 195 (a metal gate stack), as shown in FIGS. 1D and 2D in accordance with some embodiments. In some embodiments, the gate stack 195 covers a portion of the fin structure 120. In some embodiments, the halogen source layer 184 conformally covers the sidewalls and the top of the fin structure 120. Therefore, the halogen element from the halogen source layer 184 (or halogen-doped region) may diffuse to the surface of the fin structure 120 to repair defects at the sidewalls and the top of the fin structure 120. The performance and reliability of the semiconductor device structure are significantly improved. In some embodiments, some halogen elements from the halogen source layer 184 exist in the gate dielectric layer 182, the interfacial layer 181, and or a surface portion of the fin structure 120.

Figure 3:
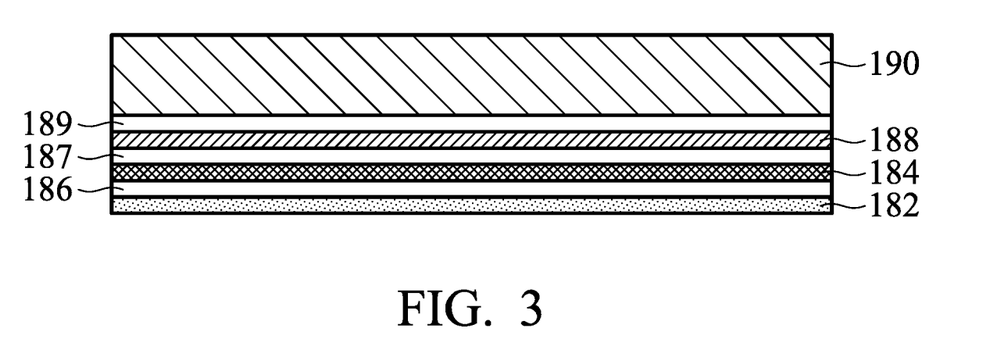
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, FIG. 3 shows a portion of the gate stack 195. In some embodiments, the halogen source layer 184 is between the gate dielectric layer 182 and the work function layer 188. However, the halogen source layer 184 is not limited to be between the gate dielectric layer 182 and the capping layer 186. In some embodiments, the capping layer 186 is between the gate dielectric layer 182 and the halogen source layer 184. In some embodiments, the halogen source layer 184 is a deposited layer formed after the formation of the capping layer 186. In some embodiments, the halogen source layer 184 is a doped region within an upper portion of the capping layer 186.

Many variations and/or modifications can be made to embodiments of the disclosure. In some embodiments, two or more halogen source layers are formed between the gate dielectric layer 182 and the work function layer 188.

Figure 4:
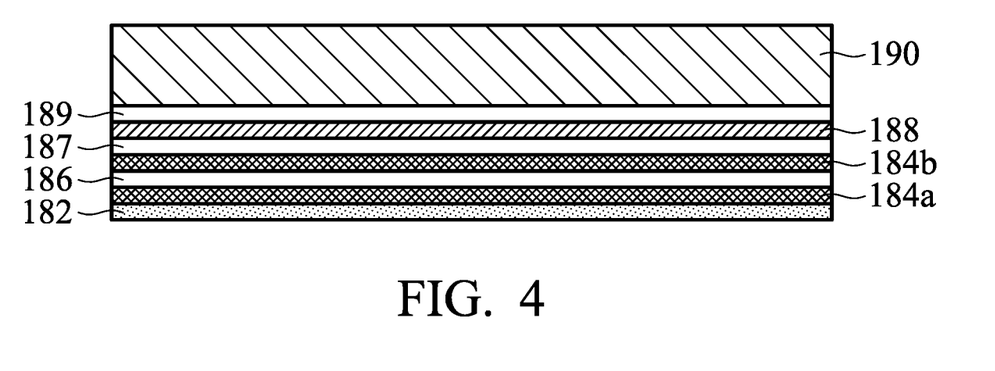
FIG. 4 is a cross-sectional view of a semiconductor device structure, in accordance with some embodiments.

FIG. 4 is a cross-sectional view of a semiconductor device structure, in accordance with some embodiments. In some embodiments, two or more halogen source layers are formed between the gate dielectric layer 182 and the conductive filling layer 190. In some embodiments, halogen source layers 184a and 184b are formed on the bottom and the top of the capping layer 186, respectively. In some embodiments, the halogen source layers 184a and 184b are deposited layers. In some embodiments, the halogen source layers 184a and 184b are halogen doped regions below and above the capping layer 186. In some embodiments, the halogen source layers 184a and 184b contain different kinds of halogen elements. In some other embodiments, the halogen source layers 184a and 184b contains the same kind of halogen element.

Figure 7:
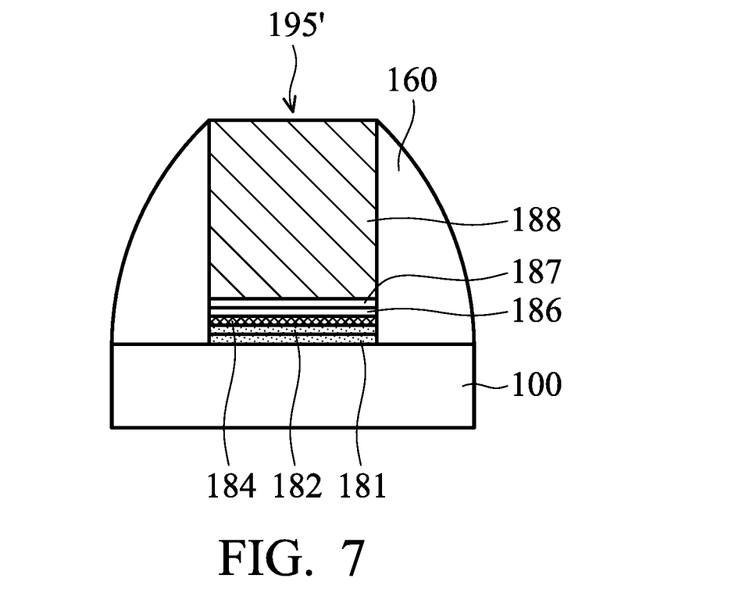
FIG. 7 is a cross-sectional view of a semiconductor device structure, in accordance with some embodiments.

Many variations and/or modifications can be made to embodiments of the disclosure. FIG. 7 is a cross-sectional view of a semiconductor device structure, in accordance with some embodiments. In some embodiments, a metal gate stack 195' is formed over the semiconductor substrate 100. Unlike the gate stack 195, the metal gate stack 195' is not formed by replacing a dummy gate stack. In some embodiments, the gate stack layers including the layers 181, 182, 184, 186, 187, and 188 are formed over the semiconductor substrate 100 and patterned to form the metal gate stack 195'. The halogen source layer 184 may provide halogen elements (or ions) to the surface of the semiconductor substrate 100 below the interfacial layer 181. The defect at the interface between the semiconductor substrate 100 and the interfacial layer 181 may therefore be repaired. For example, the number of dangling bonds at the interface is reduced. As a result, the performance and the reliability of the semiconductor device structure are improved.

Embodiments of the disclosure form a semiconductor device structure with a gate stack including a halogen source layer formed between a gate dielectric layer and a top of the gate stack. The halogen source layer is a deposited layer or a doped region over the gate dielectric layer. The halogen source layer is configured to provide a halogen element or ion to a surface of a semiconductor fin or a semiconductor substrate below the gate dielectric layer. The halogen element may repair defects (such as dangling bonds) at the surface of the semiconductor fin or the semiconductor substrate. Therefore, the performance and the reliability are greatly improved.

In accordance with some embodiments, a semiconductor device structure is provided. The semiconductor device structure includes a semiconductor substrate and a gate stack over the semiconductor substrate. The gate stack includes a gate dielectric layer and a work function layer. The gate dielectric layer is between the semiconductor substrate and the work function layer. The semiconductor device structure also includes a halogen source layer. The gate dielectric layer is between the semiconductor substrate and the halogen source layer.

In accordance with some embodiments, a semiconductor device structure is provided. The semiconductor device structure includes a semiconductor substrate and a gate stack over the semiconductor substrate. The gate stack includes a gate dielectric layer, a capping layer, and a work function layer, and the capping layer is between the gate dielectric layer and the work function layer. The semiconductor device structure also includes a halogen-doped region within the capping layer.

In accordance with some embodiments, a method for forming a semiconductor device structure is provided. The method includes forming a gate dielectric layer over a semiconductor substrate and forming a cap layer over the gate dielectric layer. The method also includes forming a halogen source layer over the gate dielectric layer. The method further includes forming a work function layer over the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a fin element extending from a substrate; and
a gate stack over the substrate, wherein the gate stack comprises a stack including:
a high-k dielectric layer,
a first layer over the high-k dielectric layer wherein the first layer includes nitrogen, fluorine, and at least one of tantalum or titanium,
a second layer over the high-k dielectric layer, wherein the second layer includes one of TiN or TaN; and
a work function layer, over the first and second layers, wherein the high-k dielectric layer is between the fin element and the first layer.

2. The semiconductor device structure of claim 1, wherein the first layer is U-shaped, the second layer is U-shaped, and the work function layer is U-shaped.

3. The semiconductor device structure of claim 1, wherein the second layer directly interfaces the high-k dielectric layer.

4. The semiconductor device structure of claim 3, wherein the first layer directly interfaces a top surface of the second layer.

5. The semiconductor device structure of claim 1, wherein a barrier layer is disposed between the first layer and the work function layer.

6. The semiconductor device structure of claim 5, wherein the barrier layer includes at least one of TiN or TaN.

7. The semiconductor device structure of claim 1, further comprising:
a third layer over the second layer, wherein the third layer includes nitrogen, fluorine, and at least one of tantalum or titanium.

8. A semiconductor device structure, comprising:
a gate stack over a semiconductor substrate, wherein the gate stack comprises:
a high-k dielectric layer;
a first layer over the high-k dielectric layer, wherein the first layer is one of TiN or TaN;
a second layer over the first layer, wherein the second layer includes at least one halogen element;
a third layer over the second layer, wherein the third layer includes one of TiN or TaN;
a work function layer over the third layer.

9. The semiconductor device structure of claim 8, wherein the gate stack further includes a conductive layer over the work function layer.

10. The semiconductor device structure of claim 8, wherein the halogen element is chlorine or bromine.

11. The semiconductor device structure of claim 8, wherein second layer includes nitrogen.

12. The semiconductor device structure of claim 8, wherein the first layer and the third layer are a same composition.

13. The semiconductor device structure of claim 8, wherein the second layer interfaces a top surface of the first layer and interfaces a bottom surface of the third layer.

14. A semiconductor device structure, comprising:
a semiconductor substrate;
a gate stack over a fin element extending above the semiconductor substrate, wherein the gate stack comprises:
a high-k dielectric layer;
a first layer over the high-k dielectric layer, wherein the first layer includes a first metal and nitrogen, wherein the first metal is at least one of Ti or Ta;
a second layer over the first layer, wherein the second layer includes a second metal, nitrogen, and at least one halogen element, wherein the second metal is at least one of Ti or Ta;
a third layer over the second layer, wherein the third layer includes a third metal and nitrogen, wherein the third metal is at least one of Ti or Ta; and
a conductive layer over the third layer.

15. The semiconductor device structure of claim 14, wherein the first metal and the second metal are a same metal element.

16. The semiconductor device structure as claimed in claim 14, wherein the first metal, the second metal, and the third metal are a same metal element.

17. The semiconductor device structure as claimed in claim 14, wherein the second layer further includes oxygen.

18. The semiconductor device structure as claimed in claim 14, wherein the first layer further includes a halogen element.

19. The semiconductor device structure as claimed in claim 14, wherein the halogen element is fluorine.

20. The semiconductor device structure of claim 10, wherein the second layer further includes oxygen.

* * * * *